United States Patent
Chen

(10) Patent No.: US 12,324,137 B2
(45) Date of Patent: Jun. 3, 2025

(54) CIRCUIT BOARD ENCLOSURE WITH COMPOSITE LINER FOR INHIBITING ELECTROSTATIC DISCHARGE

(71) Applicant: Quanta Computer Inc., Taoyuan (TW)

(72) Inventor: Ching-Jen Chen, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 265 days.

(21) Appl. No.: 18/315,728

(22) Filed: May 11, 2023

(65) Prior Publication Data

US 2024/0381599 A1 Nov. 14, 2024

(51) Int. Cl.
G06F 1/16 (2006.01)
H05K 9/00 (2006.01)

(52) U.S. Cl.
CPC ......... H05K 9/0067 (2013.01); G06F 1/1658 (2013.01)

(58) Field of Classification Search
CPC ...... G06F 1/1656; H01L 23/60; H05K 1/0259
See application file for complete search history.

(56) References Cited

U.S. PATENT DOCUMENTS

| | | | | |
|---|---|---|---|---|
| 3,645,281 A | * | 2/1972 | Seidler | B65D 75/28 206/460 |
| 4,139,097 A | * | 2/1979 | Bowman | A47F 3/14 206/511 |
| 4,160,503 A | * | 7/1979 | Ohlbach | B65D 81/00 206/709 |
| 4,211,324 A | * | 7/1980 | Ohlbach | B65D 5/2009 206/709 |
| 4,241,829 A | * | 12/1980 | Hardy | B65D 5/563 361/212 |

(Continued)

FOREIGN PATENT DOCUMENTS

TW 200939944 A 9/2009

OTHER PUBLICATIONS

TW Office Action for Application No. 112126193 mailed May 23, 2024, w/ First Office Action Summary, 7 pp.

(Continued)

*Primary Examiner* — Adrian S Wilson
(74) *Attorney, Agent, or Firm* — NIXON PEABODY LLP

(57) ABSTRACT

A computing device for inhibiting electrostatic discharge (ESD) in a computing system, the computing device including a mainboard with computing circuitry for the computing system, a tray in which the mainboard is affixed, and a composite liner for absorbing high-frequency energy and electromagnetic interference from the ESD. The composite liner includes a high-frequency energy absorption layer and an insulation layer coupled to a first surface of the high-frequency energy absorption layer. The high-frequency energy absorption layer includes a high-frequency energy absorption material, and the insulation layer includes an electrical-insulating material. A circuit board enclosure includes the composite liner and a panel with the composite liner at least partially lining an internal receiving surface of the panel. A circuit board is positioned inside the circuit board enclosure with the composite liner interposed between the circuit board and the panel to protect the electronic component from ESD.

20 Claims, 5 Drawing Sheets

(56) References Cited

U.S. PATENT DOCUMENTS

| | | | | |
|---|---|---|---|---|
| 4,293,070 A * | 10/1981 | Ohlbach | B65D 81/18 | |
| | | | 53/472 | |
| 4,404,615 A * | 9/1983 | Dep | H05K 9/0067 | |
| | | | 361/212 | |
| 4,480,747 A * | 11/1984 | Kazor | B65D 81/24 | |
| | | | 206/521 | |
| 4,565,288 A * | 1/1986 | Walther | H01L 23/60 | |
| | | | 206/718 | |
| 4,709,297 A * | 11/1987 | Walther | H05K 13/0084 | |
| | | | 206/719 | |
| 4,767,003 A * | 8/1988 | Rice | H05K 9/0067 | |
| | | | 206/508 | |
| 4,926,007 A * | 5/1990 | Aufderheide | H01B 7/0861 | |
| | | | 174/117 FF | |
| 5,017,260 A * | 5/1991 | Bardford | B65D 81/24 | |
| | | | 156/308.2 | |
| 5,133,452 A * | 7/1992 | Ohashi | H05K 13/0084 | |
| | | | 206/718 | |
| 5,232,091 A * | 8/1993 | Hennessy | H05K 13/0084 | |
| | | | 206/718 | |
| 5,263,583 A * | 11/1993 | Ohashi | H05K 13/0084 | |
| | | | 206/723 | |
| 5,348,150 A * | 9/1994 | Brenner | H05K 13/0084 | |
| | | | 206/718 | |
| 5,361,901 A * | 11/1994 | Schenz | H05K 13/0084 | |
| | | | 206/714 | |
| 5,808,358 A * | 9/1998 | Vinciarelli | H01L 23/552 | |
| | | | 257/E23.101 | |
| 5,979,660 A * | 11/1999 | Pakeriasamy | H05K 13/0084 | |
| | | | 206/718 | |
| 6,132,607 A * | 10/2000 | Chen | B03C 1/288 | |
| | | | 436/526 | |
| 6,981,585 B2 * | 1/2006 | Kitamura | B32B 27/18 | |
| | | | 257/E23.126 | |
| 6,989,196 B2 * | 1/2006 | Chatterjee | B01J 13/14 | |
| | | | 424/490 | |
| 7,223,922 B2 * | 5/2007 | Bandy, IV | G11B 5/40 | |
| 7,310,239 B1 * | 12/2007 | Fjelstad | H01L 23/66 | |
| | | | 361/764 | |
| 8,455,070 B2 * | 6/2013 | Nagai | B65D 43/164 | |
| | | | 206/706 | |
| 11,335,649 B2 * | 5/2022 | Wang | H05K 7/14329 | |
| 11,576,287 B2 * | 2/2023 | Lee | G06F 3/0679 | |
| 11,974,420 B2 * | 4/2024 | Lee | G11C 5/04 | |
| 2003/0146529 A1 * | 8/2003 | Chen | B01J 13/06 | |
| | | | 264/4.1 | |
| 2011/0194225 A1 | 8/2011 | Onishi et al. | | |

OTHER PUBLICATIONS

TW Search Report for Application No. 112126193 mailed May 23, 2024, w/ First Office Action, 1 p.

* cited by examiner

CIRCUIT BOARD ENCLOSURE WITH COMPOSITE LINER FOR INHIBITING ELECTROSTATIC DISCHARGE

FIELD OF THE INVENTION

The present invention relates generally to electronic systems, and more specifically, to a circuit board enclosure that inhibits electrostatic discharge.

BACKGROUND OF THE INVENTION

For an electronic device to be legally sold in certain regions, the electronic device must pass certain certification tests to comply with the local safety standards. In the European Union (the "EU"), for example, certain certification test requirements are set forth in the IEC 61000-4-2 Standard (the "Standard"). The IEC 61000-4-2 Standard is an immunity standard on electrostatic discharge ("ESD") published by the International Electrotechnical Commission. The publication is recognized industry-wide as the standard for ESD testing-it describes aspects of the testing including requirements, levels, test methods, and certification limits. Specifically, the certification sets out discharge limits of +/−8 kV air discharge on slots, apertures and non-conductive surfaces with performance criteria B, and +/−4 kV for contact discharge on conductive surfaces and coupling plane with performance criteria B. Similar standards exist for other countries such as in the South Korea.

FIG. 1 is an exemplary waveform of discharge current generated by a typical electrostatically charged object (i.e., ESD source). Specifically, the waveform shows a 4 kV contact discharge current waveform as defined by the IEC 6100-4-2 Standard. The IEC 6100-4-2 Standard sets requirements for the rise time $t\_r$ to the first peak (i.e., $t\_r$ being between 0.6 to 1.0 ns), the current amplitude at three time points (i.e., at the first peak, at 30 ns, and at 60 ns), and the scatter values at the respective time points (i.e., ±15% at the first peak, ±30% at 30 ns, and ±30% at 60 ns). When an ESD source is discharged, the resultant discharge current consists of a very fast edge followed by a comparatively slow bulk discharge curve. As ESD discharge derives a large current derivative (di/dt), the sudden surge in current can generate a very strong electromagnetic interference ("EMI") field, which is the disruption to the normal functioning of a circuit due to externally generated electromagnetic field. There are different EMI coupling methods through which the electromagnetic fields travel from the source to the target. The EMI can be coupled to the target via conduction, radiation, or inductive or capacitive coupling. The dominant EMI coupling method in a circuit is dependent on its frequency. At lower frequencies, EMI coupling by direct conduction is greater. As the frequency increases, other coupling methods become active. Radiation coupling is most active at higher frequencies, and resulting the fields are coupled to the weakness of circuit. As an ESD event can have a fast rise time, the resultant waveform for an ESD event includes high-frequency components with frequencies that range from DC to over 3 GHz. The resultant EMI fields can have detrimental effects on electronic components in the vicinity of the ESD event.

Conventionally, solutions for inhibiting ESD involve designing protection circuits around the input-output (I/O) pins of an electronic device or conducting the static charges to ground. Further, shielding material such as conductive gaskets are sometimes used to enhance enclosure shielding to fill gaps between a circuit board enclosure and the circuit board to prevent electromagnetic fields from entering the circuit. However, circuit board enclosures often must include openings (e.g., slots or apertures in the enclosure) for heat dissipation. The openings allow electromagnetic fields to pass through, thereby compromising the ESD protection of the shielding and bypassing the protection circuits around the I/O pins. Consequently, the inclusion of the openings on the circuit board or the circuit board enclosure can compromise the ability of the electronic device to comply with EMC (Electro Magnetic Compatibility) requirements, such as the IEC 61000-4-2 Standard, when the device is tested for immunity to ESD.

Another conventional solution for inhibiting ESD is to add system-level discrete ESD components (e.g., transient-voltage-suppression diodes) onto the circuit board. However, adding such discrete components takes up valuable space on the circuit board, complicates layout of the circuit board, and may compromise signal integrity at higher data rates.

Thus, a solution is needed to protect electronic systems from ESD entering through heat dissipation openings. A solution is also needed that also does not take up valuable space on the circuit board or complicate the circuit board layout.

SUMMARY OF THE INVENTION

In view of the foregoing shortcomings with the conventional solutions for inhibiting ESD, the present disclosure describes a composite liner that attenuates high-frequency energy generated by ESD, thus allowing certain components of a circuit board enclosure to be manufactured from non-metallic materials while still meeting the requirements and limits for ESD set by EMC standards, such as the IEC 61000-4-2 Standard. Another advantage is that the disclosed composite liner can be produced economically and easily shaped to fit with preexisting circuit board designs, thus shortening the development-to-market cycle. Moreover, the disclosed composite liner provides improved structural support to the enclosed circuit board, reducing the likelihood of bending.

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing device for inhibiting electrostatic discharge (ESD) in a computing system includes a mainboard with computing circuitry for the computing system, a tray in which the mainboard is affixed, and a composite liner for absorbing high-frequency energy and electromagnetic interference from the ESD. The composite liner is positioned in the tray between the mainboard and an internal receiving surface of the tray. The composite liner includes a high-frequency energy absorption layer and a first insulation layer. The high-frequency energy absorption layer has a first surface. The first insulation layer is coupled to the first surface of the high-frequency energy absorption layer. The high-frequency energy absorption layer includes a high-frequency energy absorption material. The first insulation layer includes a first electrical-insulating material.

According to another aspect of the computing device described above, the high-frequency energy absorption material includes a silicone gel containing magnetic particles of metal oxide and thermoconductive filler.

According to another aspect of the computing device described above, the composite liner further includes a second insulation layer including a second electrical-insulating material. The second insulation layer is coupled to a second surface of the high-frequency energy absorption layer. The second surface is opposite the first surface of the high-frequency energy absorption layer.

According to another aspect of the computing device described above, the first electrical-insulating material includes at least one of biaxially-oriented polyethylene terephthalate (Mylar), a polymide material, and a polyester material.

According to another aspect of the computing device described above, the first insulation layer is adhesively coupled to the first surface of the high-frequency energy absorption layer.

According to another aspect of the computing device described above, the first insulation layer covers substantially all of the internal receiving surface of the tray.

According to another aspect of the computing device described above, the high-frequency energy absorption layer covers a region of the tray corresponding to location of an electronic component of the mainboard.

According to another aspect of the computing device described above, the high-frequency energy absorption layer absorbs high-frequency energy from ESD entering through an aperture in the tray.

According to other aspects of the present disclosure, a circuit board enclosure for inhibiting ESD in a computing system includes a tray adapted for receiving a mainboard and a composite liner for absorbing high-frequency energy and electromagnetic interference from the ESD. The composite liner at least partially covers an internal receiving surface of the tray. The composite liner includes a high-frequency energy absorption layer and a first insulation layer. The high-frequency energy absorption layer has a first surface. The first insulation layer is coupled to the first surface of the high-frequency energy absorption layer. The high-frequency energy absorption layer includes a high-frequency energy absorption material. The first insulation layer includes a first electrical-insulating material.

According to another aspect of the circuit board enclosure described above, the high-frequency energy absorption material includes a silicone gel containing magnetic particles of metal oxide and thermoconductive filler.

According to another aspect of the circuit board enclosure described above, the composite liner further includes a second insulation layer coupled to a second surface of the high-frequency energy absorption layer. The second surface is opposite the first surface of the high-frequency energy absorption layer. The second insulation layer includes a second electrical-insulating material.

According to another aspect of the circuit board enclosure described above, the first electrical-insulating material include at least one of biaxially-oriented polyethylene terephthalate (Mylar), a polymide material, and a polyester material.

According to another aspect of the circuit board enclosure described above, the first insulation layer is adhesively coupled to the first side of the high-frequency energy absorption layer.

According to another aspect of the circuit board enclosure described above, the first insulation layer covers substantially all of the internal receiving surface of the tray.

According to another aspect of the circuit board enclosure described above, the high-frequency energy absorption layer covers a region of the tray corresponding to a predetermined location for placing an electronic component of the mainboard.

According to other aspects of the present disclosure, a composite liner includes a high frequency-energy absorption layer, a first insulation layer, and a second insulation layer. The high-frequency energy absorption layer includes a high-frequency energy absorption material. The high-frequency energy absorption layer has a first surface and a second surface opposite the first surface. The first insulation layer and the second insulation layer include a first electrical-insulating material and a second electrical-insulating material, respectively. The first insulation layer and the second insulation layer are coupled to the first surface and the second surface of the high-frequency energy absorption layer, respectively.

According to another aspect of the composite liner described above, the high-frequency energy absorption material includes a silicone gel containing magnetic particles of metal oxide and thermoconductive filler.

According to another aspect of the composite liner described above, the first electrical-insulating material and the second electrical-insulating material each include at least one of biaxially-oriented polyethylene terephthalate (Mylar), a polymide material, and a polyester material.

According to another aspect of the composite liner described above, the composite liner further includes a first bonding layer and a second bonding layer. The first bonding layer bonds the first side of the high-frequency energy absorption layer with the first insulation layer. The second bonding layer bonds the second side of the high-frequency energy absorption layer with the second insulation layer.

According to another aspect of the composite liner described above, at least one of the first electrical-insulating material and the second electrical-insulating material has flame retardant property.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
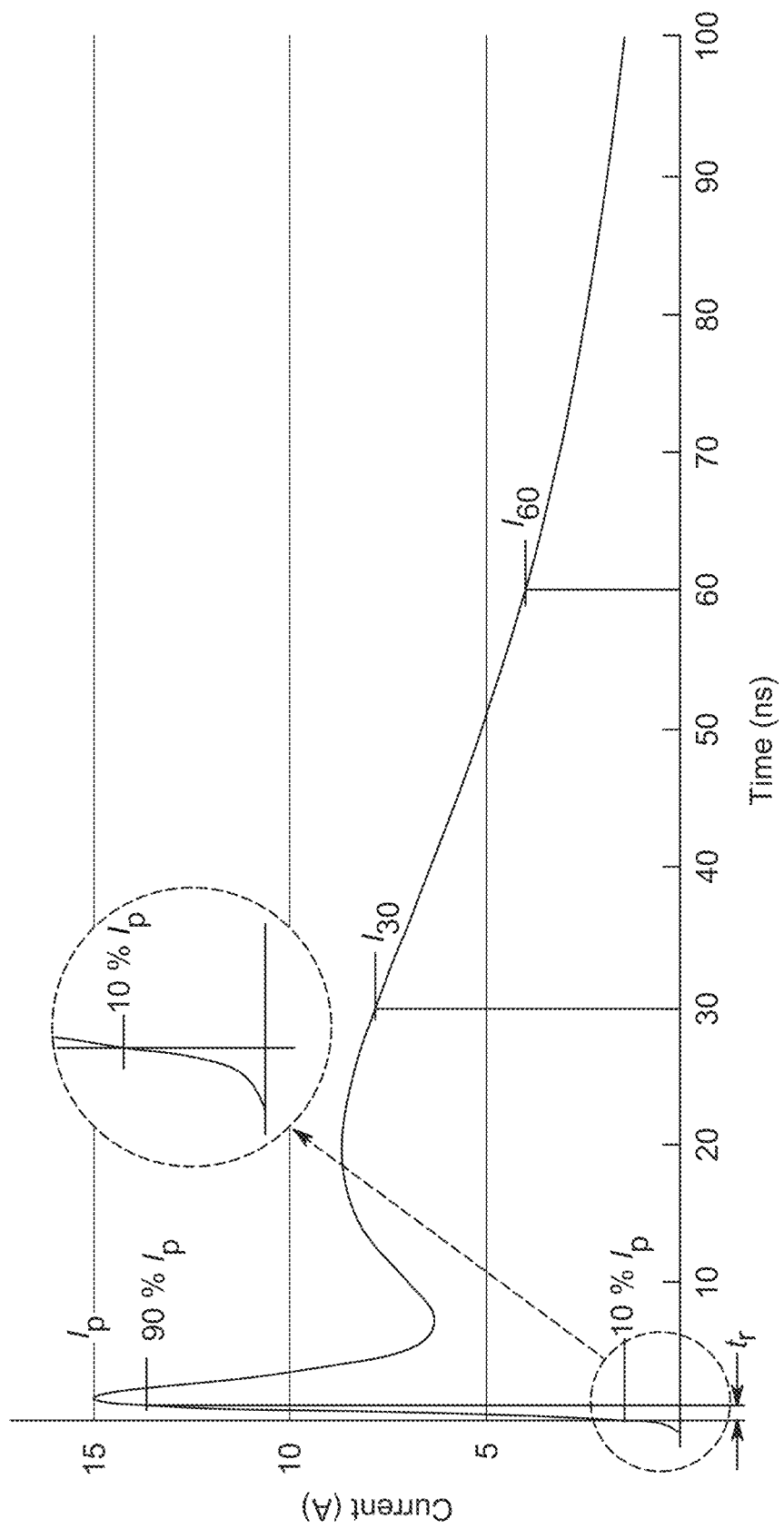
FIG. 1 is an exemplary waveform of discharge current generated by a typical ESD source.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
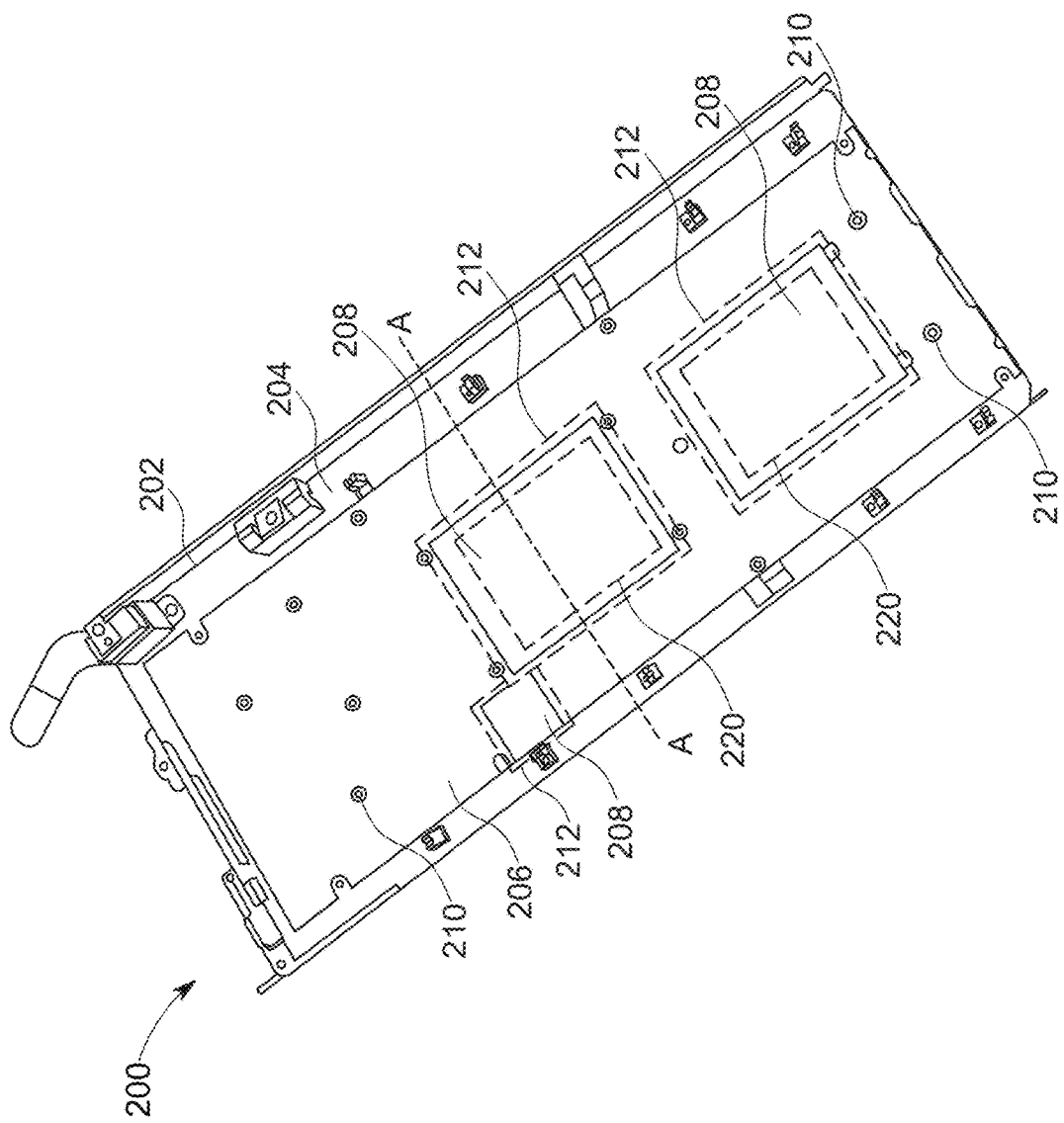
FIG. 2 is a perspective view of a lower half of a circuit board enclosure for inhibiting ESD in a computing system, according to certain aspects of the present disclosure.

FIG. 2 shows a lower half of a circuit board enclosure 200 for inhibiting ESD in a computing system, according to some embodiments of the present disclosure. According to some embodiments, the circuit board enclosure 200 includes a tray 202 with an internal receiving surface 204 and a composite liner 212 that at least partially covers the internal receiving surface 204 of the tray 202. The composite liner 212 is a combination of a first insulation layer 206 and a high-frequency energy absorption layer 208. The tray 202 is configured to receive a mainboard with computing circuitry for the computing system. Further, the tray 202 of the circuit board enclosure 200 can include one or more openings 210 (e.g., slots or apertures). For example, such openings 210 can be configured for heat dissipation or other purposes. As previously described, the openings 210 are points where ESD energy can enter the enclosure 200 and disrupt the enclosed circuit. Thus, a composite liner 212 is placed over the internal receiving surface 204 of the tray 202 to inhibit ESD that enters the circuit board enclosure 200. The first insulation layer 206 insulates the computing circuitry of a mainboard 402 (shown in FIG. 4) positioned inside the circuit board enclosure 200 from potential short-circuit between the computing circuitry and the tray 202. According to additional embodiments, the first insulation layer 206 also functions as a fire protection enclosure. The first insulation layer 206 has flame retardant properties that reduce the risk of fire spreading to the circuit board enclosure 200 and other objects nearby. Specifically, according to some embodiments, the first insulation layer 206 meets the flammability standards as set forth by the regional electronic safety standards, such as those prescribed by the Underwriter Laboratories Standard 94 (also known as UL 94). According to yet another embodiment, the first insulation layer 206 is resistant to abrasion, thus protecting the high-frequency energy absorption layer 208 from abrasion by the tray 202 of the circuit board enclosure 200. According to some embodiments, the high-frequency energy absorption layer 208 absorbs high-frequency electromagnetic energy and EMI emitted by ESD, thus reducing the impact of EMI on the computing circuitry, such as the electronic components 404 of the enclosed mainboard 402 (shown in FIG. 4).

Figure 4:
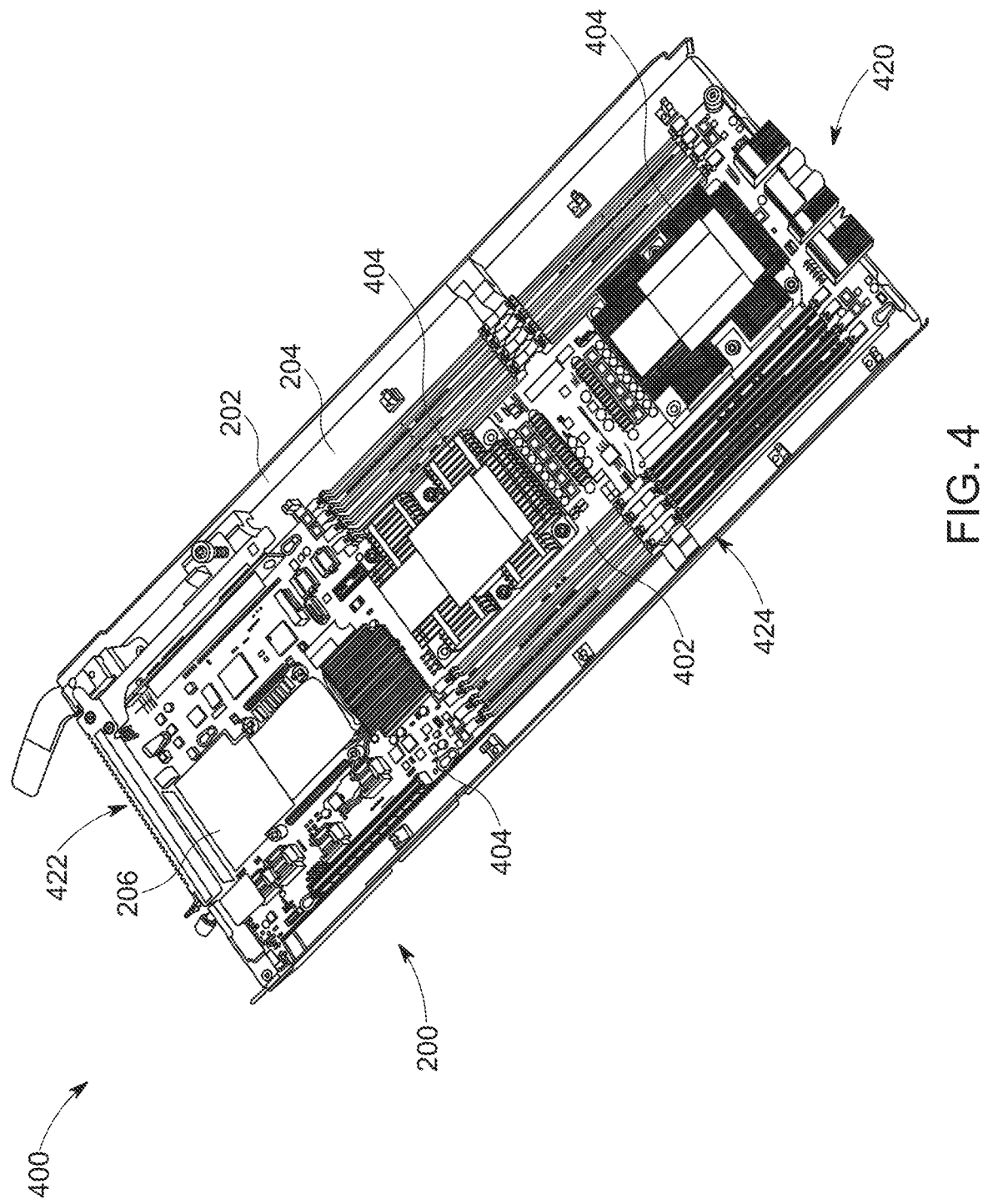
FIG. 4 is a perspective view of a computing device for inhibiting ESD in a computing system, according to certain aspects of the present disclosure.

According to some embodiments, the high-frequency energy absorption layer 208 and the first insulation layer 206 each cover all or substantially all of the internal receiving surface 204 of the tray 202. According to some other embodiments, the high-frequency energy absorption layer 208 partially covers the internal receiving surface 204 of the tray 202. For example, the high-frequency energy absorption layer 208 covers a region 220 of the tray 202 that corresponds to a predetermined location for placing electronic components 404 of the mainboard 402 (as shown in FIG. 4). The high-frequency energy absorption layer 208 can also be placed in areas where electronic components 404 on an enclosed mainboard 402 are susceptible to EMI generated by ESD. For example, these can include areas where the electronic components 404 are near openings 210 in the tray 202.

Figure 3A:
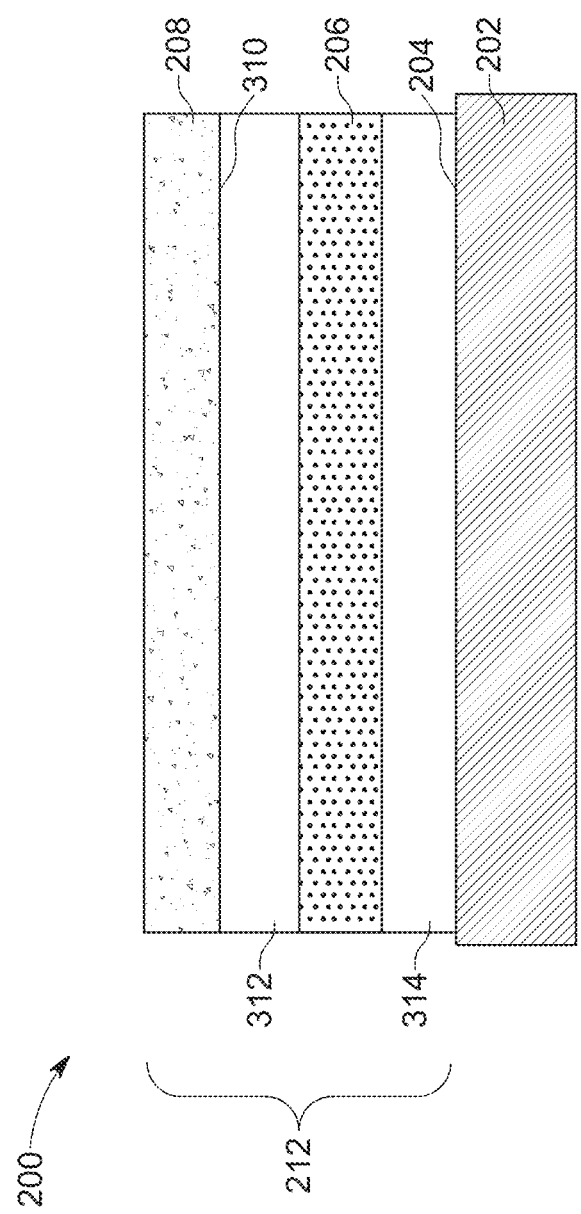
FIG. 3A a cross-sectional view of a composite liner along the A-A line in FIG. 2, according to an embodiment of the present disclosure.

FIG. 3A illustrates a cross-sectional view of the composite liner 212 along the A-A line shown in FIG. 2. According to some embodiments, the composite liner 212 includes a high-frequency energy absorption layer 208 and a first insulation layer 206. The first insulation layer 206 is coupled to a first surface 310 of the high-frequency energy absorption layer 208 and is interposed between the high-frequency energy absorption layer 208 and the tray 202 of the circuit board enclosure 200. The high-frequency energy absorption layer 208 includes a high-frequency energy absorption material while the first insulation layer 206 includes an electrical-insulating material. Various electromagnetic absorbing materials and their electromagnetic and physical characteristics have been described in various references. For example, Japanese application JP11335472 describes a high-frequency energy absorption material that can include a silicone gel containing magnetic particles of metal oxide and thermoconductive filler. According to another example, Japanese publication JP200232995 describes a laminated electromagnetic wave absorber composed of an electromagnetic wave reflection layer coated, at least on one side, with an electromagnetic wave absorption layer, where the reflection layer comprises an electroconductive filler dispersed in a silicone resin and the absorption layer comprises an electromagnetic wave absorbing filler dispersed in a silicone resin. According to some embodiments, the electrical-insulating material can include one or more of biaxially-oriented polyethylene terephthalate (also known by the trade name "Mylar"), a polymide material, or a polyester material. According to some embodiments, the first insulation layer 206 is adhesively coupled to the first surface 310 of the high-frequency energy absorption layer 208 and the internal receiving surface 204 of the tray 202 via bonding layers 312 and 314, respectively. The type of bonding agent used for the bonding layers 312 and 314 is apparent to persons of ordinary skill in the art.

Figure 3B:
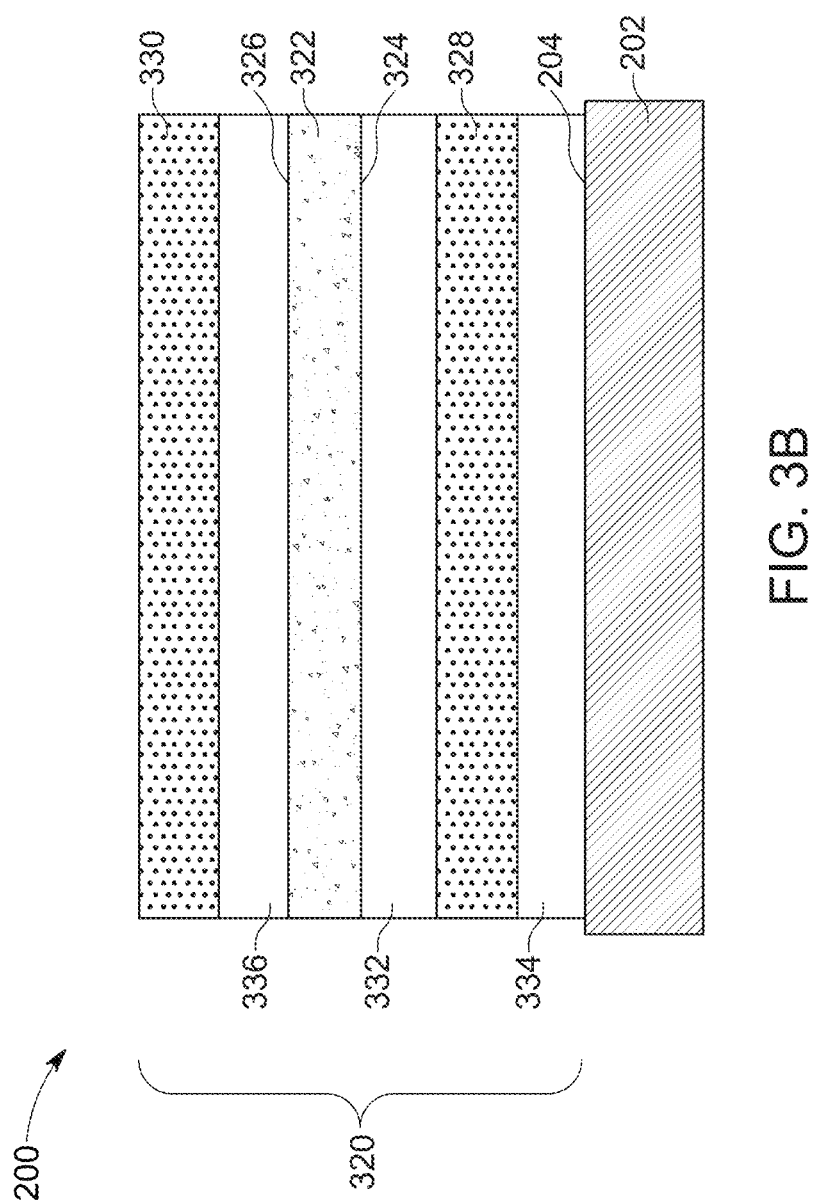
FIG. 3B is a cross-sectional view of the composite liner in FIG. 2 according to an alternative embodiment of the present disclosure.

FIG. 3B is a cross-sectional view of a composite liner 320 along the A-A line shown in FIG. 2, according to an alternative embodiment of the present disclosure. According to some embodiments, a composite liner 320 includes a first insulation layer 328 and a second insulation layer 330. The first insulation layer 328 is coupled to a first surface 324 of the high-frequency energy absorption layer 322. The second insulation layer 330 is coupled to a second surface 326 of the high-frequency energy absorption layer 322, which is opposite the first surface 324 of the high-frequency energy absorption layer 322. The first insulation layer 328 is interposed between the high-frequency energy absorption layer 322 and the tray 202 of the circuit board enclosure 200. When the circuit board enclosure 200 is fitted with a mainboard 402 (shown in FIG. 4), the second insulation layer 330 is interposed between the mainboard 402 and the high-frequency energy absorption layer 322.

According to some embodiments, the first insulation layer 328 and the second insulation layer 330 insulate one or more electronic components on a circuit board positioned inside the circuit board enclosure 200 from potential short-circuit between the electronic components and the tray 202. According to additional embodiments, at least one of the first insulation layer 328 and the second insulation layer 330 also functions as a fire protection enclosure. For example, at least one of the first insulation layer 328 and the second insulation layer 330 has flame retardant properties that reduce the risk of fire spreading to the circuit board enclosure 200 and other objects nearby. Specifically, according to some embodiments, at least one of the first insulation layer 328 and the second insulation layer 330 meets the flammability standards as set forth by the regional electronic safety standards, such as those prescribed by the Underwriter Laboratories Standard 94 (also known as UL 94).

According to yet another embodiment, the first insulation layer 328 and the second insulation layer 330 are resistant to abrasion. For example, the first insulation layer 328 protects the high-frequency energy absorption layer 322 from abrasion by the tray 202 of the circuit board enclosure 200, while the second insulation layer 330 protects the high-frequency energy absorption layer 322 from abrasion against an enclosed mainboard 402 (shown in FIG. 4) placed atop the composite liner 320. According to some embodiments, the second insulation layer 330 includes an electrical-insulating material, which can include one or more of biaxially-oriented polyethylene terephthalate (also known as Mylar), a polymide material, or a polyester material.

According to some embodiments, the first insulation layer 328 is adhesively coupled to a first surface 324 of the high-frequency energy absorption layer 322 via a first bonding layer 332, and to the internal receiving surface 204 of the tray 202 via a second bonding layer 334. Further, the second insulation layer 330 is adhesively coupled to a second surface 326 of the high-frequency energy absorption layer 322 via a third bonding layer 336.

FIG. 4 is a perspective view of the inside of an computing device 400, which includes the circuit board enclosure 200 of FIG. 2 and a mainboard 402. The mainboard 402 is placed atop the internal receiving surface 204 of the tray 202. The mainboard 402 includes a series of electronic components 404 such as processors, memory modules, capacitors, resistors, interface slots and the like.

A composite liner 212 is interposed between the tray 202 and the mainboard 402. According to some embodiments, the composite liner 212 includes a high-frequency energy absorption layer 208 (shown in FIG. 2) and a first insulation layer 206. According to some embodiments, the high-frequency energy absorption layer 208 (shown in FIG. 2) and the first insulation layer 206 cover all or substantially all the internal receiving surface 204 of the tray 202. According to some other embodiments, only the first insulation layer 206 covers all or substantially all of the internal receiving surface 204 of the tray 202, while the high-frequency energy absorption layer 208 (shown in FIG. 2) covers a region of the tray 202 corresponding to location of an electronic component (e.g., processors) 404 of the mainboard 402 (shown in FIG. 4). According to some embodiments, the high-frequency energy absorption layer covers a region of tray 202 where the electronic components 404 (e.g., processors) are susceptible to EMI generated by ESD. For example, these can include areas where the electronic components 404 are near the openings 210 (shown in FIG. 2) in the tray 202.

The computing device 400 shown in FIG. 4 with the composite liner 212 (shown in FIGS. 2 and 3A) was tested for compliance with the IEC 61000-4-2 Standard using setup specified in EC 61000-4-2:2008 ED.2.0. According to testing classification, Criteria A indicates that the system continues to perform normally after having a test voltage applied. Criteria B indicates that the system had suffered a temporary loss of function or temporary degradation of performance but does not require intervention from an operator. Criteria C indicates that the system has received re-settable errors and is recoverable after receiving intervention from the operator. Two methods—air discharge and contact discharge—were used to test whether a system satisfies certification limits specified in EN 55035:2017+A11:2020. Using the air discharge method, the tested electronic system must demonstrate the ability to withstand ESD event to a level satisfying Criteria B after receiving ESD up to +/−8 kV on slots, apertures and non-conductive surfaces of the tested electronic system. Using the contact discharge method, the tested electronic system must demonstrate the ability to withstand ESD event to a level satisfying criteria B after receiving ESD up to +/−4 kV on conductive surfaces of the tested electronic device and coupling planes adjacent thereto. The testing voltage levels specified by EN 55035:2017+A11:2020 are provided in Table 1 below.

TABLE 1

| Level | Contact Discharge Test Voltage (+/− kV) | Air Discharge Test Voltage (+/− kV) |
| --- | --- | --- |
| 1 | 2 | 2 |
| 2 | 4 | 4 |
| 3 | 6 | 8 |

TABLE 1-continued

| Level | Contact Discharge Test Voltage (+/− kV) | Air Discharge Test Voltage (+/− kV) |
|---|---|---|
| 4 | 8 | 15 |
| X | Custom | Custom |

Tables 2 and 3 shown below tabulate the results for tests performed on an embodiment of the computing device 400 with lead-in wire. The specified test voltages (i.e., +/−2 kV, 4 kV, 6 kV, 8 kV, and 12 kV) were applied to the computing device 400 from the front 420, the back 422, and the tray exterior surface 424 of the circuit board enclosure 408, as well the vertical and horizontal coupling planes of a testing table. Detailed description of an exemplary test table setup, including the placement of the vertical and horizontal coupling planes relative to a device under test (e.g., the computing device 400) can be found under Section 7.2.2 of the IEC 61000-4-2. Tables 2 and 3 show the test results for an embodiment of the computing device 400 with lead-in wire where the testing is performed using the contact discharge method and the air discharge method, respectively. As the test results indicate, after the specified test voltages were applied, the computing device 400 operated normally (Criteria A) or continued to operate normally without the intervention from an operator after undergoing a temporary loss of function or temporary degradation of performance (Criteria B). Thus, in the case of the embodiment of the computing device 400 with lead-in wire, the addition of the composite liner 212 enhances the anti-ESD performance of computing device 400 to a degree that meets the IEC 61000-4-2 Standard.

TABLE 2

| Applied to | 2 kV | 4 kV | 6 kV | 8 kV |
|---|---|---|---|---|
| Enclosure Front | A/A | B/B | B/B | B/B |
| Enclosure Back | A/A | A/A | A/A | A/A |
| Enclosure Surface | A/A | A/A | A/A | A/A |
| Vertical Coupling Plane | A/A | A/A | A/A | A/A |
| Horizontal Coupling Plane | A/A | A/A | A/A | A/A |

TABLE 3

| Applied to | 2 kV | 4 kV | 6 kV | 8 kV | 12 kV |
|---|---|---|---|---|---|
| Enclosure Front (Slot and apertures and insulating surfaces) | A/A | A/A | A/A | B/B | B/B |
| Enclosure Back Power Cord Area | A/A | A/A | A/A | A/A | A/A |
| Enclosure Surface | A/A | A/A | A/A | A/A | A/A |

Tables 4 and 5 shown below tabulate the results for tests performed on an embodiment of the computing device 400 without lead-in wire. Similar to the previous tests, the specified test voltages were applied to the computing device 400 from the front 420, the back 422, and the exterior surface 424 of the circuit board enclosure 408, as well the vertical and horizontal coupling planes of a testing table. Tables 4 and 5 show the test results for an embodiment of the computing device 400 without lead-in wire where the testing is performed using the contact discharge method and the air discharge method, respectively. As the test results indicate, a computing device 400 without lead-in wire can operate normally (Criteria A) when the specified test voltages are applied to the back 422 and the exterior surface 424 of the circuit board enclosure 408, as well to the vertical and horizontal coupling planes of a testing table. However, when certain test voltages were applied to the front 420 of the circuit board enclosure 424, the embodiment of the computing device 400 without lead-in wire received re-settable errors that are recoverable only after receiving intervention from the operator (Criteria C). Specifically, the computing device 400 received resettable errors meeting Criteria C when the test voltage level exceeded 4 kV using the contact discharge method and 8 kV using the air discharge method. Due to the front 420 of the circuit board enclosure 424 not being able to meet the requirements of Criteria A or B, the embodiment without lead-in wire does not meet the IEC 61000-4-2 Standard. Nonetheless, the test results of Tables 2-5 demonstrate that the addition of the composite liner 212 enhances the anti-ESD performance of the computing device 400.

TABLE 4

| Applied to | 2 kV | 4 kV | 6 kV | 8 kV |
|---|---|---|---|---|
| Enclosure Front | A/A | C/C | C/C | C/C |
| Enclosure Back | A/A | A/A | A/A | A/A |
| Enclosure Surface | A/A | A/A | A/A | A/A |
| Vertical Coupling Plane | A/A | A/A | A/A | A/A |
| Horizontal Coupling Plane | A/A | A/A | A/A | A/A |

TABLE 5

| Applied to | 2 kV | 4 kV | 6 kV | 12 kV |
|---|---|---|---|---|
| Enclosure Front | A/A | A/A | C/C | C/C |
| Enclosure Back | A/A | A/A | A/A | A/A |
| Enclosure Surface | A/A | A/A | A/A | A/A |
| Vertical Coupling Plane | A/A | A/A | A/A | A/A |
| Horizontal Coupling Plane | A/A | A/A | A/A | A/A |

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A computing device for inhibiting electrostatic discharge (ESD) in a computing system, the computing device comprising:
   a mainboard with computing circuitry for the computing system;
   a tray in which the mainboard is affixed, the tray having an internal receiving surface; and a composite liner for absorbing high-frequency energy and electromagnetic interference from the ESD, the composite liner being positioned in the tray between the mainboard and the internal receiving surface, the composite liner including
a high-frequency energy absorption layer including a high-frequency energy absorption material, the high-frequency energy absorption layer having a first surface; and
a first insulation layer including a first electrical-insulating material, the first insulation layer being coupled to the first surface of the high-frequency energy absorption layer.

2. The computing device of claim 1, wherein the high-frequency energy absorption material includes a silicone gel containing magnetic particles of metal oxide and thermoconductive filler.

3. The computing device of claim 1, wherein the composite liner further includes a second insulation layer including a second electrical-insulating material, the second insulation layer being coupled to a second surface of the high-frequency energy absorption layer opposite the first surface of the high-frequency energy absorption layer.

4. The computing device of claim 3, wherein the first electrical-insulating material includes at least one of biaxially-oriented polyethylene terephthalate (Mylar), a polymide material, and a polyester material.

5. The computing device of claim 1, wherein the first insulation layer is adhesively coupled to the first surface of the high-frequency energy absorption layer.

6. The computing device of claim 1, wherein the first insulation layer covers substantially all of the internal receiving surface of the tray.

7. The computing device of claim 6, wherein the high-frequency energy absorption layer covers a region of the tray corresponding to location of an electronic component of the mainboard.

8. The computing device of claim 1, wherein the high-frequency energy absorption layer absorbs high-frequency energy from ESD entering through an aperture in the tray.

9. A circuit board enclosure for inhibiting ESD in a computing system, the circuit board enclosure comprising:
a tray adapted for receiving a mainboard with computing circuitry for the computing system, the tray having an internal receiving surface; and
a composite liner for absorbing high-frequency energy and electromagnetic interference from the ESD, the composite liner at least partially covering the internal receiving surface of the tray, the composite liner including
a high-frequency energy absorption layer including a high-frequency energy absorption material, the high-frequency energy absorption layer having a first surface; and
a first insulation layer including a first electrical-insulating material, the first insulation layer being coupled to the first surface of the high-frequency energy absorption layer.

10. The circuit board enclosure of claim 9, wherein the high-frequency energy absorption material includes a silicone gel containing magnetic particles of metal oxide and thermoconductive filler.

11. The circuit board enclosure of claim 9, wherein the composite liner further includes a second insulation layer including a second electrical-insulating material, the second insulation layer being coupled to a second side of the high-frequency energy absorption layer, the second side being opposite the first side of the high-frequency energy absorption layer.

12. The circuit board enclosure of claim 9, wherein the first electrical-insulating material include at least one of biaxially-oriented polyethylene terephthalate (Mylar), a polymide material, and a polyester material.

13. The circuit board enclosure of claim 9, wherein the first insulation layer is adhesively coupled to the first side of the high-frequency energy absorption layer.

14. The circuit board enclosure of claim 9, wherein the first insulation layer covers substantially all of the internal receiving surface of the tray.

15. The circuit board enclosure of claim 9, wherein the high-frequency energy absorption layer covers a region of the tray corresponding to a predetermined location for placing an electronic component of the mainboard.

16. A composite liner for inhibiting ESD in a computing system, the composite liner comprising:
a high-frequency energy absorption layer including a high-frequency energy absorption material, the high-frequency energy absorption layer having a first surface and a second surface opposite the first surface;
a first insulation layer including a first electrical-insulating material, the first insulation layer being coupled to the first surface of the high-frequency energy absorption layer; and
a second insulation layer including a second electrical-insulating material, the second insulation layer being coupled to the second surface of the high-frequency energy absorption layer.

17. The electronic system of claim 16, wherein the high-frequency energy absorption material includes a silicone gel containing magnetic particles of metal oxide and thermoconductive filler.

18. The composite liner of claim 16, wherein the first electrical-insulating material and the second electrical-insulating material each include at least one of biaxially-oriented polyethylene terephthalate (Mylar), a polymide material, and a polyester material.

19. The composite liner of claim 16 further comprising:
a first bonding layer bonding the first side of the high-frequency energy absorption layer with the first insulation layer; and
a second bonding layer bonding the second side of the high-frequency energy absorption layer with the second insulation layer.

20. The composite liner of claim 16, wherein at least one of the first electrical-insulating material and the second electrical-insulating material has flame-retardant property.

* * * * *